US011302652B2

(12) United States Patent
Wang et al.

(10) Patent No.: US 11,302,652 B2
(45) Date of Patent: Apr. 12, 2022

(54) SEMICONDUCTOR PACKAGE SUBSTRATE WITH A SMOOTH GROOVE ABOUT A PERIMETER OF A SEMICONDUCTOR DIE

(71) Applicant: TEXAS INSTRUMENTS INCORPORATED, Dallas, TX (US)

(72) Inventors: ChienHao Wang, Taipei (TW); Bob Lee, New Taipei (TW); YuhHarng Chien, Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 34 days.

(21) Appl. No.: 16/724,179

(22) Filed: Dec. 20, 2019

(65) Prior Publication Data

US 2021/0193590 A1     Jun. 24, 2021

(51) Int. Cl.
*H01L 23/00* (2006.01)
*H01L 23/31* (2006.01)
*H01L 23/495* (2006.01)
*H01L 21/48* (2006.01)
*H01L 21/56* (2006.01)
*H01L 21/68* (2006.01)
*G06T 7/00* (2017.01)
*G06T 7/70* (2017.01)

(52) U.S. Cl.
CPC .......... *H01L 23/562* (2013.01); *G06T 7/0004* (2013.01); *G06T 7/70* (2017.01); *H01L 21/4825* (2013.01); *H01L 21/4842* (2013.01); *H01L 21/565* (2013.01); *H01L 21/681* (2013.01); *H01L 23/3114* (2013.01); *H01L 23/4952* (2013.01); *H01L 23/49513* (2013.01); *H01L 23/49541* (2013.01); *H01L 23/49582* (2013.01); *G06T 2207/30148* (2013.01)

(58) Field of Classification Search
CPC ............... H01L 23/562; H01L 23/3114; H01L 23/49841; H01L 23/4952; H01L 23/49513; H01L 21/4825; H01L 21/565; H01L 21/4842; H01L 21/681; H01L 24/05; H01L 24/45
See application file for complete search history.

(56) References Cited

U.S. PATENT DOCUMENTS

| | | |
|---|---|---|
| 6,828,660 B2 | 12/2004 | Abbott |
| 7,183,657 B2 | 2/2007 | Furtaw et al. |
| 7,358,617 B2 | 4/2008 | Cruz et al. |
| 8,044,495 B2 | 10/2011 | Abbott |
| 8,158,460 B2 | 4/2012 | Abbott |
| 8,587,099 B1 | 11/2013 | Abbott |
| 9,054,092 B2 | 6/2015 | Gallegos et al. |

(Continued)

*Primary Examiner* — Quoc D Hoang
(74) *Attorney, Agent, or Firm* — Dawn Jos; Charles A. Brill; Frank D. Cimino

(57) ABSTRACT

A semiconductor package includes a metallic pad and leads spaced from the metallic pad by a gap, the metallic pad including a roughened surface. The semiconductor package further includes a semiconductor die including bond pads, and an adhesive between the roughened surface of the metallic pad and the semiconductor die, therein bonding the semiconductor die to the metallic pad, wherein the adhesive includes a resin. The metallic pad further includes a groove surrounding the semiconductor die on the roughened surface, the groove having a surface roughness less than a surface roughness of the roughened surface of the metallic pad.

20 Claims, 9 Drawing Sheets

(56) References Cited

U.S. PATENT DOCUMENTS

| | | | |
|---|---|---|---|
| 2007/0269930 A1 | 11/2007 | Gupta et al. | |
| 2013/0025745 A1 | 1/2013 | Abbott et al. | |
| 2014/0001620 A1* | 1/2014 | Shimizu | H01L 23/49541 257/676 |
| 2014/0048934 A1* | 2/2014 | Chen | H01L 21/563 257/738 |
| 2019/0311974 A1* | 10/2019 | Hashizume | H01L 23/3121 |

* cited by examiner

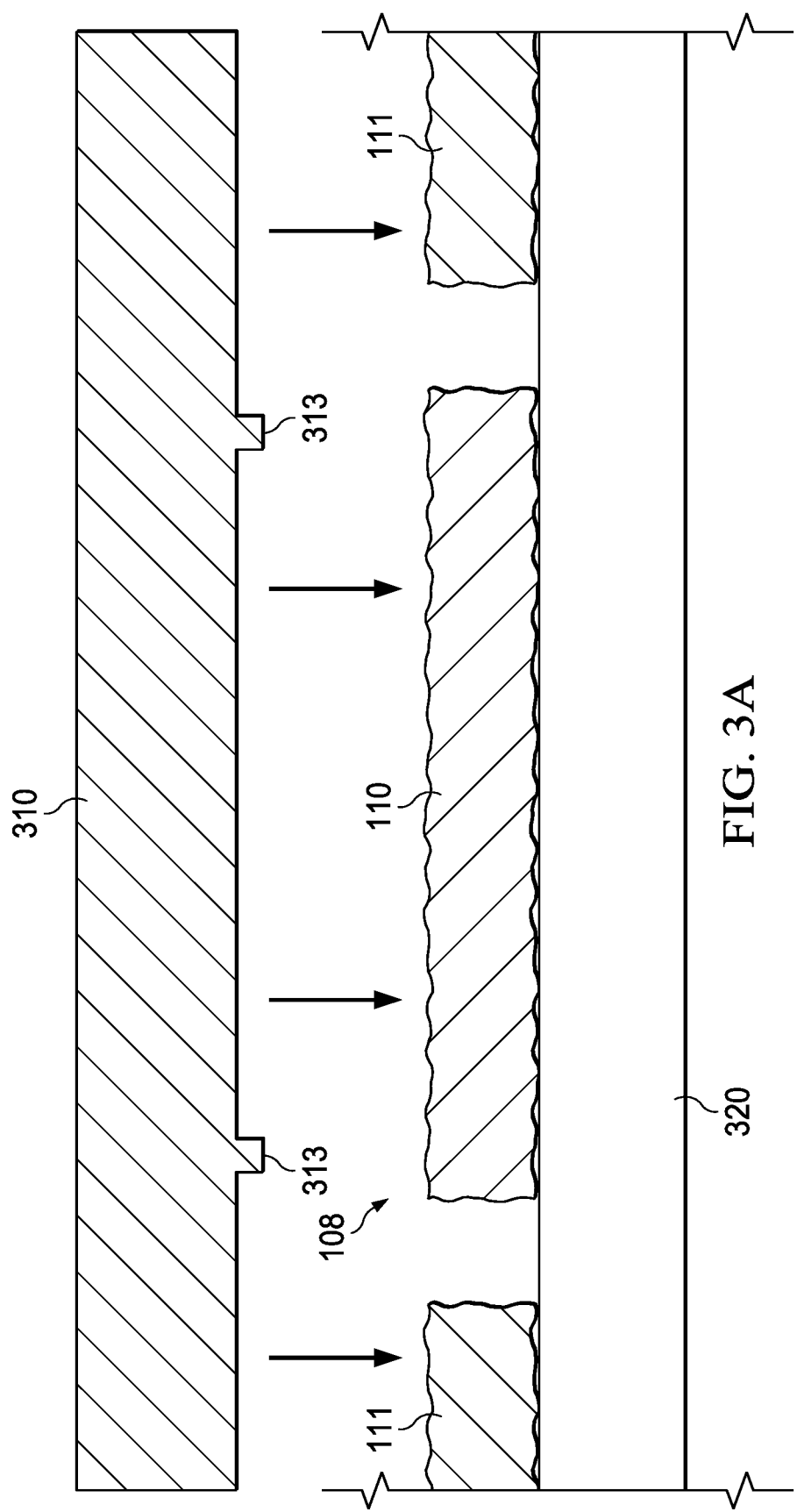

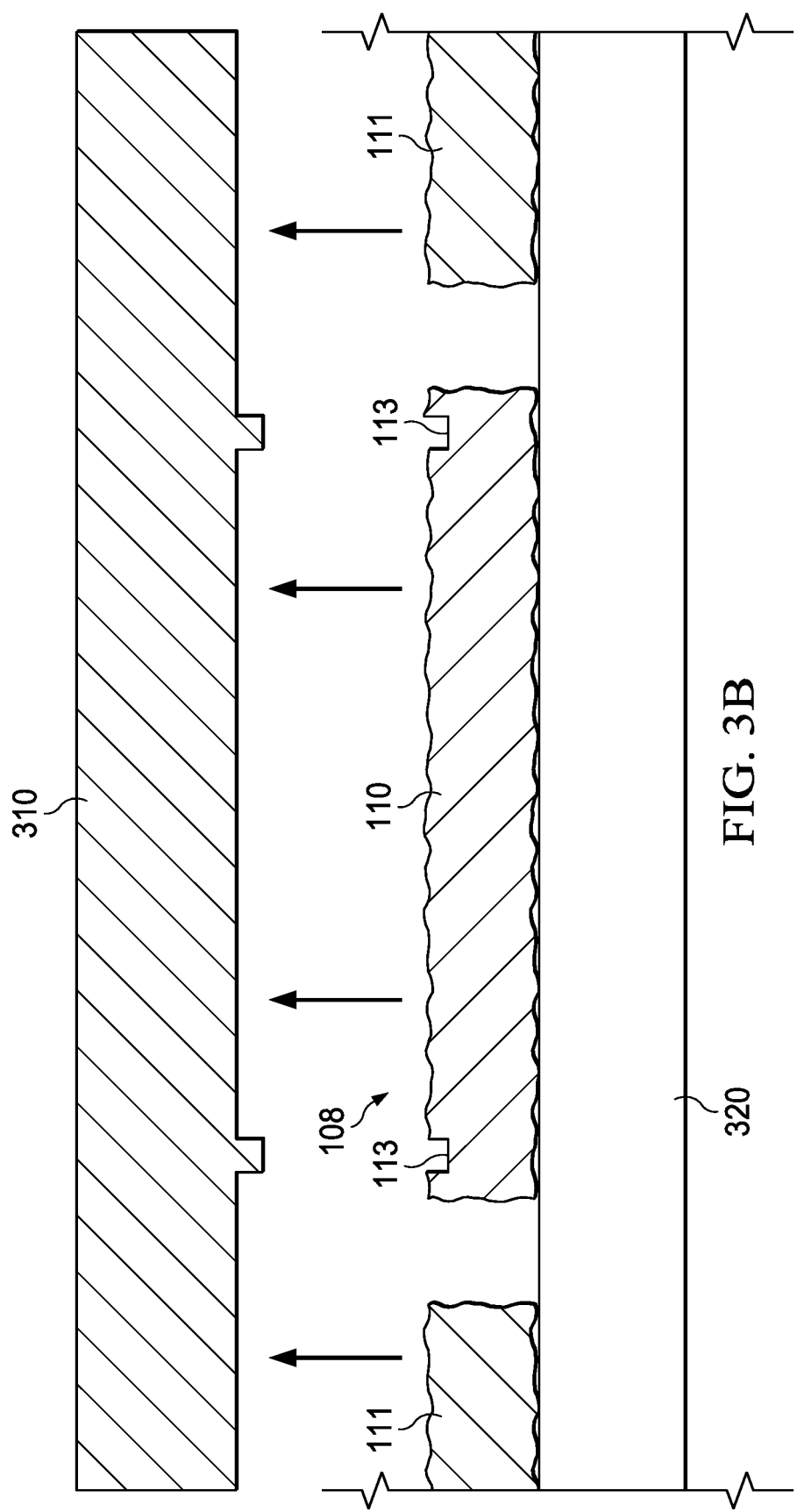

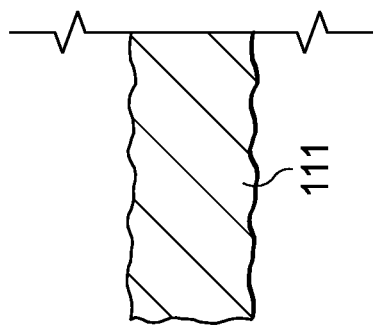
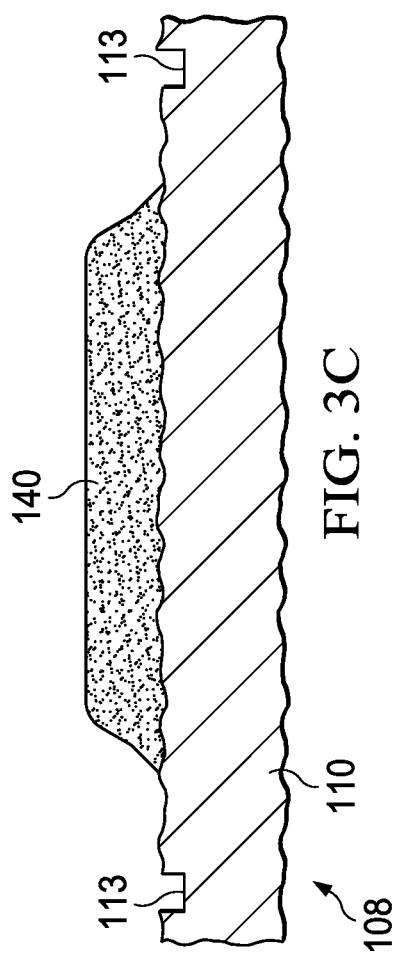
FIG. 3C
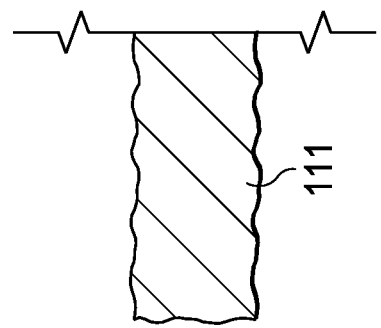
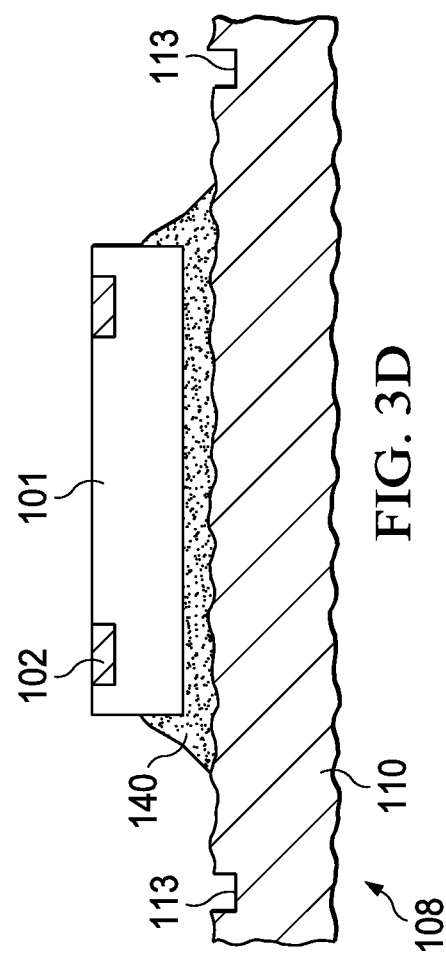
FIG. 3D
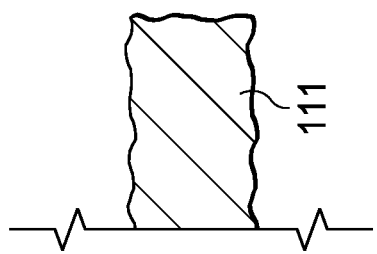
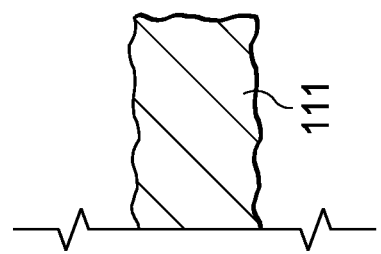

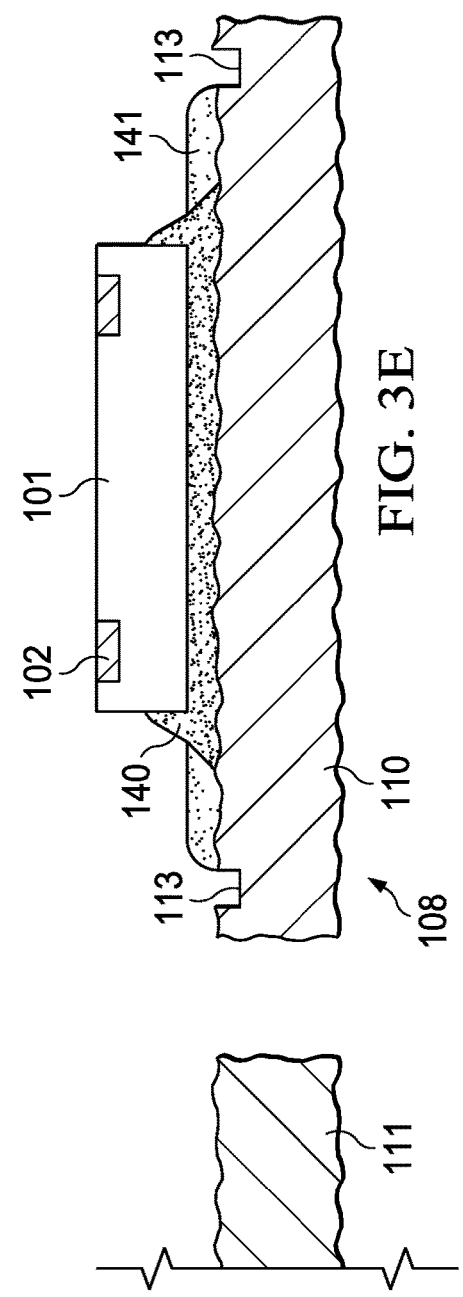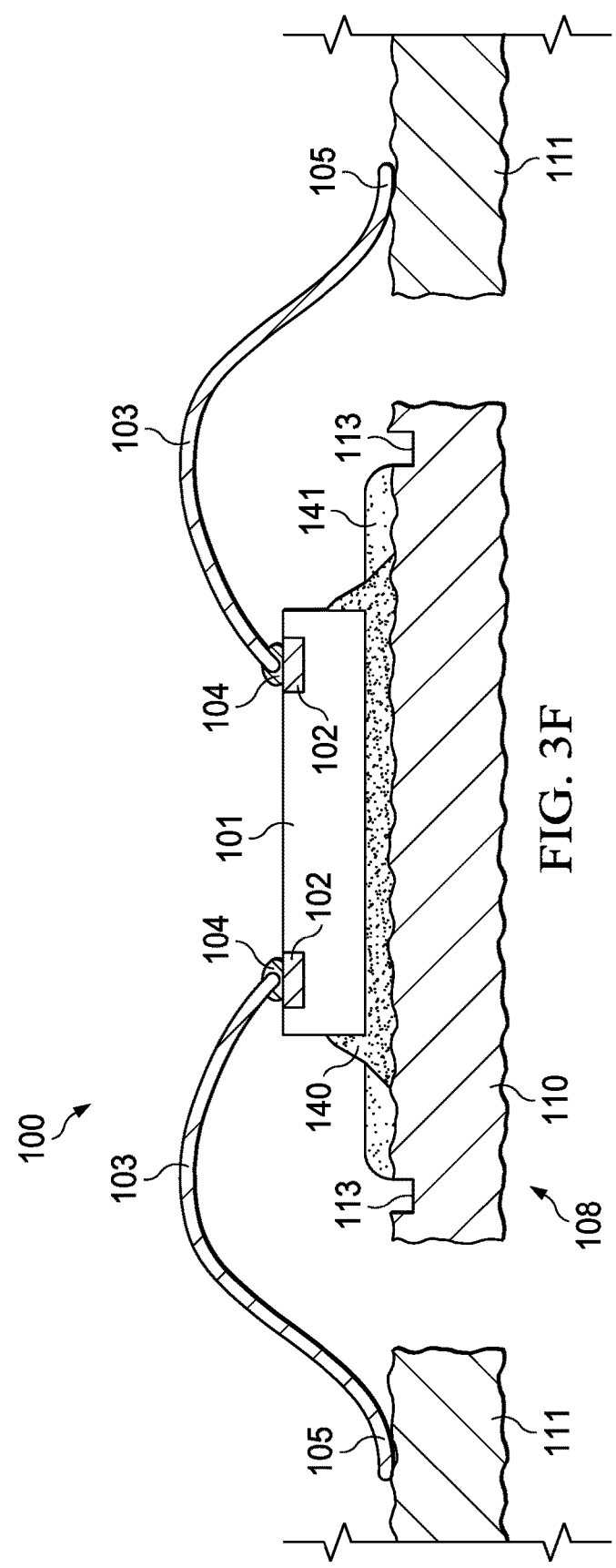

| # | OPTION | DRAWING | PROCESS | | | |
|---|---|---|---|---|---|---|
| | | | STAMPING | COINING | ETCHING | LASER MILLING |
| 1 | RECTANGULAR SHAPE |  | X | X | X | X |
| 2 | ROUND SHAPE 1 |  | X | X | X | X |
| 3 | ROUND SHAPE 2 |  | X | | X | X |
| 4 | TRIANGULAR SHAPE 1 |  | X | | | X |
| 5 | TRIANGULAR SHAPE 2 |  | X | | | X |
| 6 | "V" SHAPE |  | X | | | X |
| 7 | "W" SHAPE |  | X | | | X |
| 8 | COINING |  | | X | | X |

SEMICONDUCTOR PACKAGE SUBSTRATE WITH A SMOOTH GROOVE ABOUT A PERIMETER OF A SEMICONDUCTOR DIE

TECHNICAL FIELD

This disclosure relates to semiconductor packages.

BACKGROUND

Semiconductor packages may include a leadframe with a pad and one or more leads separated from the pad, and a semiconductor die, such as an integrated circuit (IC) chip, bonded on the pad. The pad serves as a substrate providing a stable support for firmly positioning the semiconductor die within the semiconductor package during manufacturing, whereas the leads provide electrical connections from outside the package to the active surface of the semiconductor die. Leadframes are commonly manufactured from thin, such as about 120 to 250 micrometers (μm) thick sheets of base metal. The shape of the leadframe is stamped or etched from the original sheet. Base metals commonly used for leadframes include copper, copper alloys, aluminum, aluminum alloys, iron-nickel alloys, and nickel-cobalt ferrous alloys.

Gaps between the inner end of the leads and contact pads on the active surface of the semiconductor die are bridged by connectors, typically wire bonds—thin metal wires individually bonded to both the contact pads and the leads. Consequently, the surface of the inner lead ends has to be metallurgically suitable for attaching the wire bonds.

The end of the leads remote from the semiconductor die are configured for electrical and mechanical connection to external circuitry such as printed circuit boards. This attachment may include soldering, conventionally with a tin alloy solder at a reflow temperature above 200° Celsius. Consequently, the surface of the outer lead ends may have a metallurgical configuration suitable for reflow attachment to external parts.

Mold compound may cover the pad, the semiconductor die, and portions of the leads. In some examples, the mold compound may be an epoxy-based thermoset compound applied with a transfer molding process.

A number of techniques may be utilized to improve adhesion between semiconductor package materials, such as the leadframe and mold compound. As an example, adhesion between leadframe elements and epoxy-based mold compounds can be improved by adding a roughened surface to some or all leadframe elements. In some examples, textured features such as indentations, grooves or protrusions to the leadframe surface. Another example to improve adhesion is the method to chemically modify the leadframe surface by oxidizing the metal surface, for instance creating a metal oxide layer, such as copper oxide. Copper oxide is known to adhere well to epoxy-based mold compounds.

Another example of known technology to increase adhesion between the leadframe and mold compound in semiconductor packages, is the roughening of the whole leadframe surface by chemically etching the leadframe surface after stamping or etching the pattern from a metal sheet. Chemical etching is a subtractive process using an etchant. When, for some device types, the roughening of the metal has to be selective, protective masks may be applied to restrict the chemical roughening to the selected leadframe areas; the application of masks is material-intensive and thus expensive. In some examples, chemical etching may create a micro-crystalline metal surface with a roughness on the order of 1 μm or less.

Yet another known method to achieve a roughened surface is the use of a specialized nickel-plating bath to deposit a rough nickel layer. This method is an additive process; a protective photomask may be used to restrict the deposition to selected leadframe portions. In some examples, a rough nickel layer may create a metal surface with a roughness on the order of 1 to 10 μm.

BRIEF SUMMARY

While techniques for roughened surfaces have improved adhesion between semiconductor package materials, such as a leadframe and mold compound, the roughened surfaces have created additional challenges. As one example, die attach adhesive flows more readily across a roughened leadframe surface than a smooth leadframe surface due to protuberances of the roughened surface interfering with surface tension forces of the liquid die attach adhesive that would otherwise restrict the flow of the die attach adhesive.

Semiconductor packages disclosed herein include leadframes with generally roughened surfaces, but grooves forming perimeters on surfaces of die pads. A groove restricts flow of die attach adhesive and/or resin bleed from the die attach adhesive, allowing for an increased fillet height of the adhesive compared to alternatives that do not restrict flow. In some examples, a groove may be implemented by stamping, coining or etching the roughened surface of a leadframe, thereby tamping down protuberances forming the roughened surface.

In one example, a semiconductor package includes a metallic pad and leads spaced from the metallic pad by a gap, the metallic pad including a roughened surface. The semiconductor package further includes a semiconductor die including bond pads, and an adhesive between the roughened surface of the metallic pad and the semiconductor die, therein bonding the semiconductor die to the metallic pad, wherein the adhesive includes a resin. The metallic pad further includes a groove surrounding the semiconductor die on the roughened surface, the groove having a surface roughness less than a surface roughness of the roughened surface of the metallic pad.

In another example, a method for fabricating a semiconductor package includes applying an adhesive including a resin to a roughened surface of a metallic pad inside of a perimeter formed by a groove on the roughened surface, the groove having a surface roughness less than a surface roughness of the roughened surface. The semiconductor package further includes leads spaced from the metallic pad by a gap. The method further includes positioning a semiconductor die including bond pads on the metallic pad in contact with the adhesive such that the groove surrounds the semiconductor die on the roughened surface, and curing the adhesive to bond the semiconductor die to the metallic pad.

In a further example, a semiconductor package includes a metallic pad and leads spaced from the metallic pad by a gap, a side of the metallic pad including a roughened surface with a pad surface roughness of 1 to 50 micrometers (μm). The metallic pad includes a planar base metal and layer of nickel plated on the base metal to form the roughened surface. The semiconductor package further includes a semiconductor die including bond pads, and an adhesive between the roughened surface of the metallic pad and the semiconductor die, therein bonding the semiconductor die to the metallic pad, wherein the adhesive includes a resin. The metallic pad further includes a groove forming a rectangular shape surrounding the semiconductor die on the roughened surface, the groove having a groove surface roughness of less than 0.5 μm. The semiconductor package also includes wire bonds extending between the bond pads of and the leads, and mold compound covering the semiconductor die, the adhesive, the roughened surface of the metallic pad, and the wire bonds, and at least partially covering the leads.

BRIEF DESCRIPTION OF THE DRAWINGS

FIGS. 3A-3F illustrate conceptual process steps for manufacturing a semiconductor package with a groove forming a perimeter on a pad of a leadframe, such as the semiconductor package of FIGS. 1 and 2.

DETAILED DESCRIPTION

Figure 1:
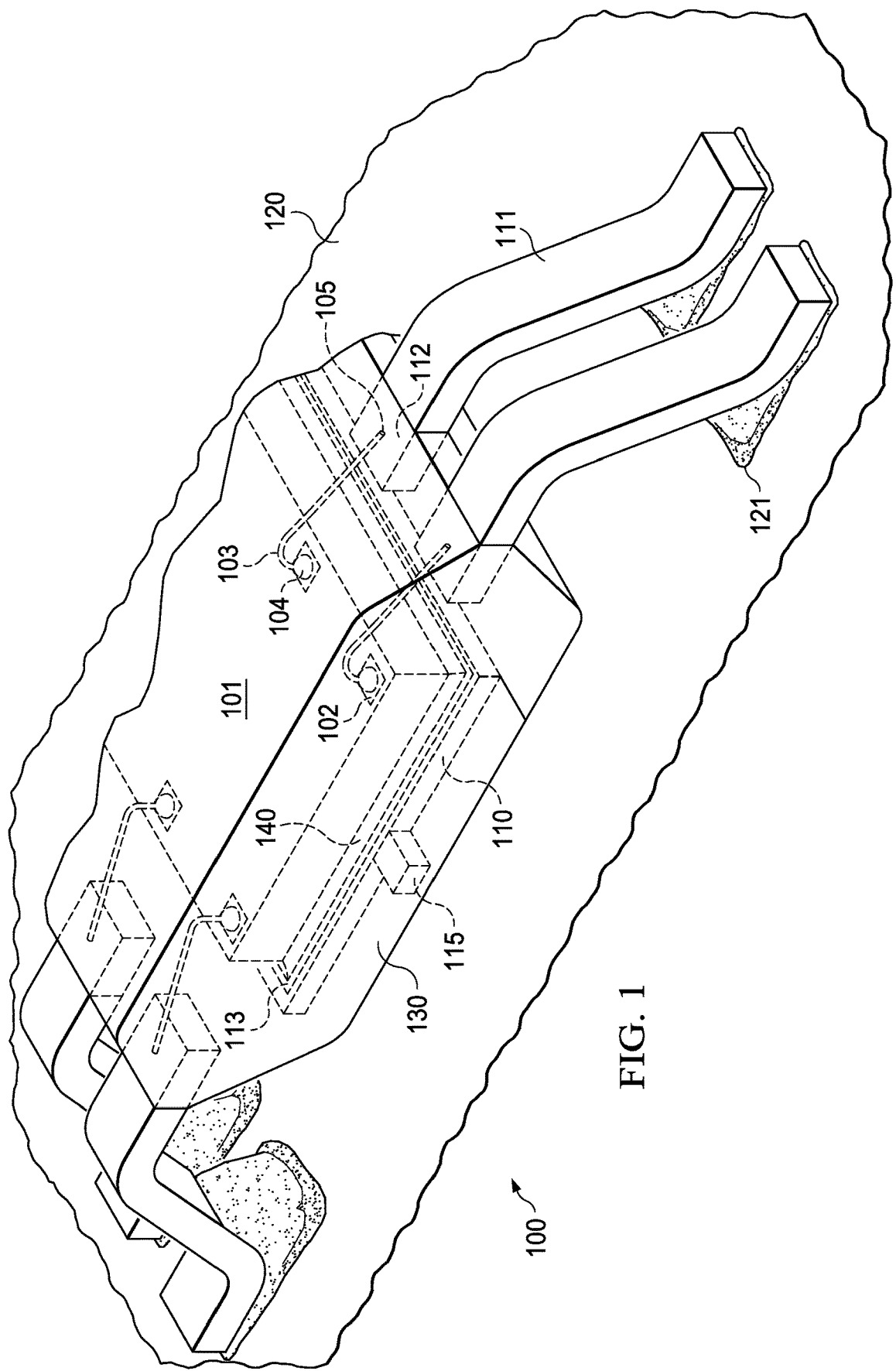
FIG. 1 is a perspective hidden view of a portion of a semiconductor package with a groove forming a perimeter on a pad of a leadframe, the groove restricting flow of die attach adhesive on the pad.

Semiconductor packages may include a metallic leadframe with a metallic pad and one or more leads separated from the pad, and a semiconductor die bonded on the pad. Semiconductor packages may further include a mold compound covering the pad, the semiconductor die, and portions of the leads. Such semiconductor packages may be created by a molding process, with a polymer compound, such as an epoxy formulation filled with inorganic granules, molded around an assembled semiconductor die and leadframe portions. In this process, a leadframe with the attached and bonded semiconductor die is placed in the cavity of a steel mold. Viscous mold compound is pressured into the cavity to fill the cavity and surround the semiconductor die and leadframe portions without voids. After polymerizing the compound, for example, by cooling to ambient temperature, the mold is opened, while the mold compound remains adhered to the molded parts.

The reliability of the adhesion between the mold compound and the covered parts of a semiconductor package depends on the integrity in time and temperature of the interfaces between the mold compound and the parts, as well as the ability to handle mechanical stresses during manufacture and operation. Mechanical interlocking of mold compound and parts may handle physical expansions and contractions based on different coefficients of thermal expansion to prevent delamination. A leadframe including a pad and leads may include a roughened surface in order to improve interlocking with the mold compound. In different examples, the roughened surface may be created using a variety of techniques, such as oxidation of a metal surface, chemical etching, and/or application of a rough nickel layer over a base metal of a leadframe.

However, die attach adhesive flows more readily across the roughened surface than a smooth surface of a leadframe. This result may cause difficulty in manufacturing of semiconductor packages. For example, with a roughened surface, a desired thickness of die attach adhesive on a pad of the leadframe may no longer be supported by its own surface tension, which may undesirably reduce a fillet height of the die attach adhesive on a semiconductor die mounted to the pad. As another example, while curing a die attach adhesive, resin of the die attach adhesive may bleed out more readily across the roughened surface than a smooth surface of a leadframe. Because mold compound may not adhere particularly well to die attach adhesive or its resin, leadframe surfaces covered by resin bleed may be more susceptible to delamination. Accordingly, controlling the flow of die attach adhesive and/or resin bleed may mitigate delamination and thus improve the robustness and reliability of semiconductor packages.

Semiconductor packages disclosed herein include leadframes with a generally roughened surface, but a groove forming a perimeter on a surface of a die pad. The groove may restrict flow of die attach adhesive, allowing for increased fillet height of the adhesive compared to alternatives that do not restrict flow. In the same or different examples, the groove may restrict the area of resin bleed from the die attach adhesive. In some examples, the groove may be implemented by stamping, coining or etching the roughened surface of the leadframe, thereby tamping down protuberances forming the roughened surface. One example of such a semiconductor package is shown and described with respect to FIGS. 1 and 2.

FIG. 1 is a perspective hidden view of a portion of semiconductor package 100 assembled by solder 121 on a board 120, such as a printed circuit board (PCB). Semiconductor package 100 includes a semiconductor die 101 bonded with a die attach adhesive 140 onto a metallic pad 110 of a metallic leadframe 108. Pad 110 includes a groove 113 which forms a perimeter surrounding semiconductor die 101. Groove 113 restricts the flow of a resin bleed 141 on pad 110 before and/or during the curing of die attach adhesive 140. Semiconductor package 100 further includes a mold compound 130 covering pad 110, semiconductor die 101 and at least partially covering leads 111, such as covering only end portions 112 of each of leads 111. Leads 111 of leadframe 108 enable the solder attachment to board 120.

In the example of semiconductor package 100, leads 103 are shaped as cantilevered leads; in other examples, the leads may have other configurations, including but not limited to, the shape of flat leads as used in Quad Flat No-Lead (QFN) devices or in Small Outline No-Lead (SON) devices.

Figure 2:
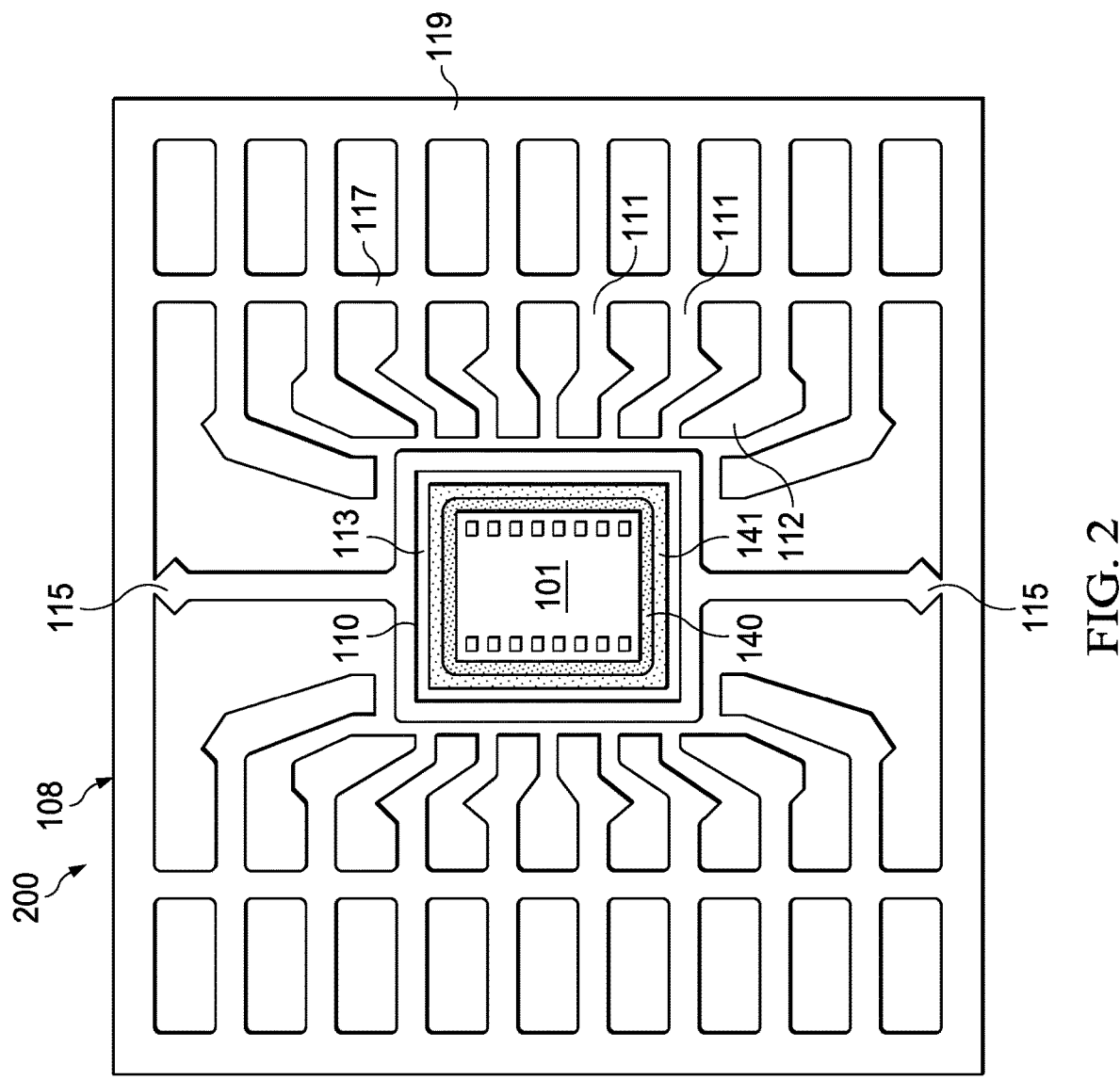
FIG. 2 is a top view of the leadframe, semiconductor die, and die attach adhesive of the semiconductor package of FIG. 1 prior to application of a mold compound.

FIG. 2 is a top view of components of semiconductor package 100 including a portion of a leadframe strip 200 including leadframe 108 prior to application of mold compound 130. The illustrated portion of leadframe strip 200 includes a siderail 119, a dam bar 117, pad 110, leads 111, and pad straps 115, which connect pad 110 to siderail 119. The portion of leadframe strip 200 is shown in the middle of manufacturing of semiconductor package 100—after semiconductor die 101 is bonded with die attach adhesive 140 onto pad 110, but before wire bonds 103 have been applied to connect bond pads 102 to leads 111, and before the application of mold compound 130 to cover components of semiconductor package 100. For reference, the components shown in FIG. 2 correspond to the partially assembled package shown and described with respect to FIG. 3E.

Semiconductor die 101 may include any combination of semiconductor elements such as transistors and integrated circuits. In various examples of this disclosure, semiconductor die 101 may be implemented using any semiconductor material employed in industry, such as a silicon, gallium arsenide, gallium nitride, silicon germanium, or other semiconductor material. In addition, the techniques of this disclosure may be applied to semiconductor packages with any combination of active and passive components on a leadframe in addition to semiconductor die 101.

Leadframe 108 includes pad 110 and leads 111 spaced from pad 110 by a gap. Pad 110 is a substrate providing a stable support for firmly positioning semiconductor die 101 within semiconductor package 100. Leadframe 108 further includes pad straps 115 which extend between pad 110 to an external surface of semiconductor package 100. Pad straps 115 function to support pad 110 within a leadframe strip prior to molding of mold compound 130 and singulation of semiconductor package 100 from an array of semiconductor packages manufactured on a common leadframe strip.

As shown in FIG. 1, bond pads 102 of semiconductor die 101 are electrically connected by wire bonds 103 to respective leads 111. Each of wire bonds 103 include a ball bond 104 on one end to connect to a respective bond pad 102 and a stitch bond 105 to connect to a respective lead 111. Semiconductor die 101, wire bonds 103 and pad 110 are covered by mold compound 130. End portions 112 of leads 111, which carry stitch bonds 105, are also covered by mold compound 130.

Leadframe 108, including pad 110 and leads 111, is shaped from a planar base metal of a consistent thickness. In various examples, the base metal of leadframe 108 may include copper, copper alloys, aluminum, aluminum alloys, iron-nickel alloys, or nickel-cobalt ferrous alloys. For many devices, the parallel surfaces of the flat leadframe base metal are treated to create strong affinity for adhesion to plastic compound, especially mold compounds. As an example, the surfaces of metal leadframes may be oxidized to create a metal oxide layer, such as copper oxide. Other methods include plasma treatment of the surfaces, or deposition of thin layers of other metals on the base metal surface. In some examples, the planar base metal may be plated with a plated layer enabling metal-to-metal bonding and resistant to oxidation. In an example, the plated layer may include a layer of nickel plated on the base metal and a layer of palladium plated on the nickel layer. Some of such examples, a layer of gold may be plated on the palladium layer. As an example for copper leadframes, plated layers of tin may be used, or a layer of nickel, about 0.5 to 2.0 µm thick in some examples, followed by a layer of palladium, about 0.01 to 0.1 µm thick in the same or different examples, optionally followed by an outermost layer of gold, about 0.003 to 0.009 µm thick in the same or different examples. Such base metal and plating combinations provide resistance to corrosion, such as oxidation, at exposed portions of the leadframe while facilitating wire bonds between leadframe 108 and bond pads 102 of semiconductor die 101.

While leadframe 108 includes sixteen leads 111, the techniques of this disclosure may be applied to any package configuration with leads or leadless package configurations. For example, other semiconductor packages may include more or less leads, such as at least six leads, at least eight leads, or even more than sixteen leads.

Leadframes, such as leadframe 108, are formed on a single sheet of metal by stamping or etching. Multiple interconnected leadframes may be formed from a single sheet of substrate, the interconnected leadframes referred to as a leadframe strip. Leadframes on the sheet can be arranged in rows and columns. Tie bars, such as pad straps 115, interconnect leads and other elements of a leadframe to one another as well as to elements of adjacent leadframes in a leadframe strip. A siderail, such as siderail 119 may surround the array of leadframes to provide rigidity and support leadframe elements on the perimeter of the leadframe strip. The siderail may also include alignment features to aid in manufacturing.

Usually die mounting, die to lead attachment, such as wire bonding, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate semiconductor packages, each semiconductor package including a singulated leadframe, at least one die, electrical connections between the die and leadframe (such as gold or copper wire bonds) and the mold compound which covers at least part of these structures.

Tie bars and siderails may be removed during singulation of the packages formed with a single leadframe strip. The term leadframe of represents the portions of the leadframe strip remaining within a package after singulation. With respect to semiconductor package 100, leadframe 108 includes pad 110, two pad straps 115, and sixteen leads 111, although some of these elements are not interconnected following singulation of semiconductor package 100 into a discrete package.

Pad 110 of leadframe 108 includes a roughened surface adjacent to die attach adhesive 140, which may improve adhesion between mold compound 130 and pad 110 and may also improve adhesion between pad 110 and die attach adhesive 140. The roughened surface of leadframe 108 covers at least the die attachment side of pad 110. In some examples, the roughened surfaces of leadframe 108 may include one side of all components of leadframe 108. In other examples, the roughened surfaces of leadframe 108 may include both sides of all components of leadframe 108 or may only cover the die attach side of pad 110.

In various examples, a number of techniques may be utilized to provide the roughened surface. As examples, the leadframe surface may be oxidized, for instance creating a metal oxide layer, such as copper oxide. In another examples, the leadframe surface may include a microcrystalline metal layer created by chemical etching, or the leadframe base metal may be plated with a rough metal layer, such as a rough nickel layer in order to form the roughened surface.

Semiconductor die 101 is bonded on pad 110 with die attach adhesive 140. Adhesive 140 includes a plurality of components including a resin. The resin may include epoxy resins, polyurethane resins, and/or silicone resins. The resin may be filled or unfilled and die attach adhesive 140 may further include one or more of the following: hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected to lower CTE (to match die), increase thermal conductivity, increase elastic modulus of adhesive 140 compared to the resin base. Particulate fillers may be selected to reduce strength characteristics such as tensile strength and flexural strength compared to the resin base materials.

Due to the roughened surface of pad 110, die attach adhesive 140 and/or resin bleed 141 flows more readily across pad 110 than alternative substrates with smoother surface. Pad 110 further includes groove 113 surrounding semiconductor die 101 on a roughened surface of pad 110. As referred to herein a groove, is an elongated recess in a surface of a component. In some examples, all surfaces of pad 110 are roughened except for the groove 113; in other examples, only one side of pad 110 is roughened.

In some examples, the roughened surface of pad 110 may provide a surface roughness of at least 1.0 micrometers (μm), such as of at least 10 μm, or within a range of 1.0 μm to 50 μm. In contrast, a surface roughness of groove 113 may be less than half of the surface roughness of the roughened surface of pad 110, such as less than one fourth of the surface roughness of the roughened surface of pad 110 and/or less than 0.5 μm. In some examples, groove 113 may be implemented by stamping, coining or etching the roughened surface of the leadframe, thereby tamping down protuberances forming the roughened surface.

Groove 113 forms a rectangular perimeter on the surface of pad 110 that faces semiconductor die 101. Groove 113 is configured to restrict the flow of components of adhesive 140 from bleeding onto areas the roughened surface of pad 110 outside groove 113. The areas of resin bleed 141 from adhesive 140 are shown in FIG. 2. Because areas of resin bleed 141 may inhibit adhesion between the roughened surface of pad 110 and mold compound 130, semiconductor package 100 may have improved adhesion between pad 110 and mold compound 130 compared to alternatives without groove 113.

A length of each side of groove 113 is greater than the length of the adjacent side of semiconductor die 101, such as between 0 percent and 25 percent greater than the length of the adjacent side of semiconductor die 101. For example, with a 2 mm by 2 mm die, a length of each side of the rectangular perimeter may be between 2.1 mm and 2.5 mm, such as about 2.25 mm. In other examples, groove 113 may form a different shape on the surface of pad 110. In the same or different examples, groove 113 may have a depth of at least the surface roughness of the roughened surface of pad 110, such as within a range of 1 μm to 50 μm, such as within a range of 20 μm to 30 μm, such as about 25 μm. A width of groove 113 may be at least wide as the depth of groove 113, such as between 1-3 times the depth of groove 113. In some of such examples, the width of groove 113 may be within a range of 2 μm to 100 μm, such as within a range of 10 μm to 60 μm, such as such as within a range of 25 μm to 50 μm.

While semiconductor die 101 is bonded to pad 110, bond pads 102 of semiconductor die 101 are electrically connected to leads 111 with wire bonds 103. Wire bonds 103 each include a metal wire extending from a respective bond pad 102 to a respective lead 111. The metal wires of wire bonds 103, are made of electrically conductive materials, such as copper, gold, or aluminum. Each of wire bonds 103 include a ball bond by a squashed ball attached the respective bond pad 102, and a stitch bond attached to the respective lead 111.

A wire bonding process may begin with positioning semiconductor die 101 on a heated pedestal to raise the temperature to between 150 and 300° C. For copper and aluminum wires, ball formation and bonding may be performed in a reducing atmosphere such as dry nitrogen gas with a few percent hydrogen gas.

With the wire bonding process, the wire is strung through the capillary of an automated bonder. A capillary is an elongated tube of an inert material such as a ceramic with a fine bore (the capillary in the strict sense) suitable for guiding a metal wire used to form the wire bonds. At the wire end extruding from the capillary tip, a free air ball may be created by melting the wire end using either a flame or a spark technique. The capillary is moved towards an attachment area of either leadframe 108 or one of bond pads 102. For a bond pad, the attachment area may be an alloy of aluminum and copper, for an attachment area of the leadframe, the attachment area may consist of the leadframe base metal or include one of the coating metal discussed above. The free air ball of melted wire is pressed against the metallization of the attachment area by a compression force, often combined with ultrasonic movement of the ball relative to the attachment area, transmitting ultrasonic energy, in order to create a ball bond, such as ball bond 104.

The bonding process results in a metal nail head or squashed ball, such as ball bond 104. In a specific example of ball bond 104, the attachment process of squashing free air balls against the metal, such as aluminum, of bond pads 102 may create layers of intermetallic compounds.

In other examples, the attachment process of squashing free air balls against a different metal, such as palladium or gold, which may be associated with plated leads 111 creates metal interdiffusion. Metal interdiffusion is also the process which provides strength to stitch bonds, such as stitch bond 105, where ultrasonic agitation is not provided.

After the ball attachment, the capillary with the wire may be lifted to span an arch from the ball bond, such as ball bond 104, to an attachment area on a substrate or a leadframe, such as a lead stitch area of one of leads 111. When the wire touches the attachment area surface, the capillary tip is pressed against the wire in order to flatten it and thus to form a stitch bond, such as stitch bond 105, sometimes referred to as a wedge bond.

Mold compound 130 forms an overmold that covers leadframe pad 110, semiconductor die 101, wire bonds 103, as well as end portions 112 of leads 111. Mold compound 130 provides a protective outer layer for semiconductor die 101 and wire bonds 103 formed in a molding process. In some examples, mold compound 130 includes an epoxy such as an epoxy-based thermoset polymer. Reliable adhesion between the packaging compound and the covered parts supports satisfactory operation of semiconductor devices since delamination degrades the capability to keep moisture and impurities out and interferes with conductive heat dissipation. As discussed previously, roughened surfaces of leadframe 108 improve adhesion between components of leadframe 108 and mold compound 130.

Figure 4:
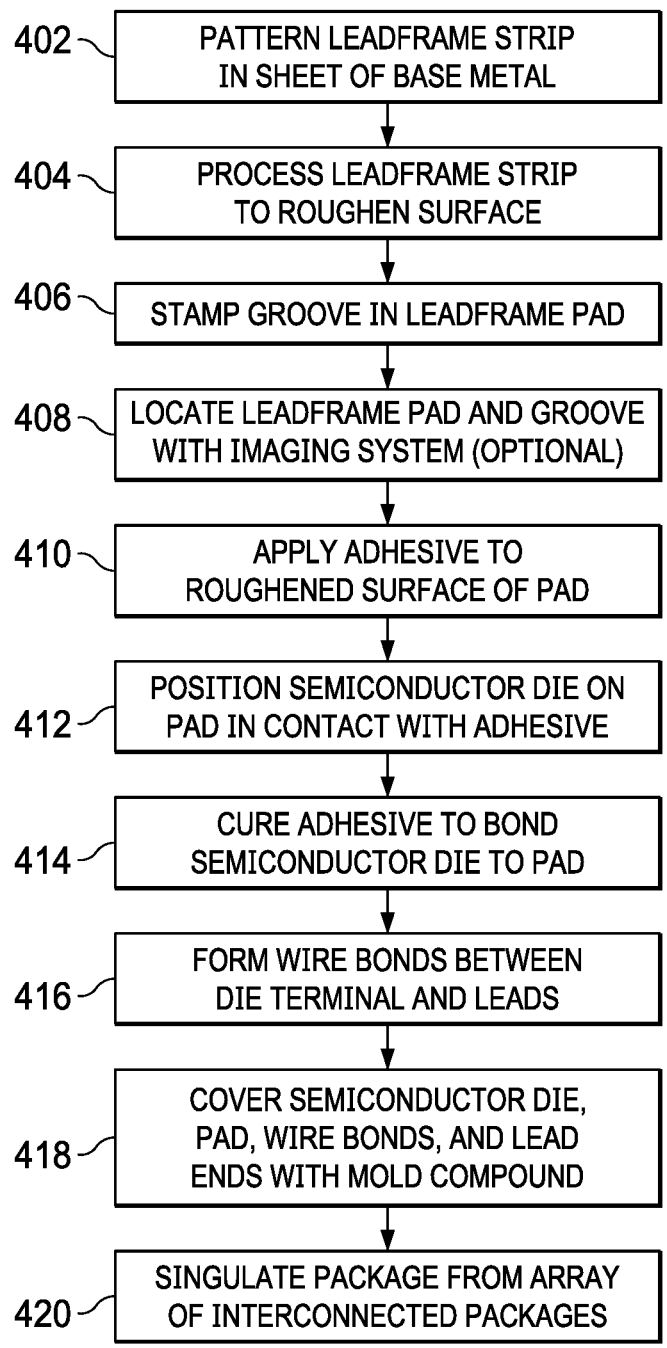
FIG. 4 is a flowchart of a method of fabricating a semiconductor package with a groove forming a perimeter on a pad of a leadframe, such as the semiconductor package of FIGS. 1 and 2.

FIGS. 3A-3F illustrate conceptual process steps for manufacturing a semiconductor package 100. FIG. 4 is a flowchart of a method of fabricating a semiconductor package with a groove forming a perimeter on a pad of a leadframe, such as such as semiconductor package 100. For clarity, the method of FIG. 4 is described with reference to semiconductor package 100 and FIGS. 3A-3F; however, the described techniques may be adapted to other package designs and are not limited to the specific example of semiconductor package 100.

First, the shape of leadframe strip 200 (FIG. 2), including leadframe 108 as one of a plurality of interconnected leadframes, is patterned in a base metal, such as a copper (FIG. 4, step 402). In various examples, manufacturing leadframe strip 200 may include stamping or photo etching a planar base metal to form the shape of leadframe strip 200. Leadframe strip 200 includes multiple interconnected leadframes 108 with pads 110 and leads 111, as well the elements to interconnect adjacent leadframes, such as pad straps 115 and optional siderail(s) 119.

At least one side of the base metal is treated to provide a roughened surface (FIG. 4, step 404). In different examples, one or more of a variety of techniques roughened surface may be create the roughened surface, such as mechanically adding textured features such as indentations, grooves or protrusions to the leadframe surface, oxidation of a surface of the base metal or a plated metal, chemical etching, and/or application of a rough nickel layer over a base metal of a leadframe.

As shown in FIG. 3A, leadframe 108, as part of leadframe strip 200, is placed in a stamp including an upper die 310 with a rectangular protrusion 313 and a bottom die 320 serving as a platform for a stamping operation. As shown in FIG. 3B, upper die 310 stamps the roughened surface of pad 110 to form groove 113 with rectangular protrusion 313 (FIG. 4, step 406). As leadframe 108 is part of leadframe strip 200, upper die 310 may include additional protrusions to stamp grooves into each pad of the other leadframes of leadframe strip 200 in unison.

FIGS. 3C-3E illustrate steps for bonding semiconductor die 101 to a roughened surface of pad 110 within a perimeter formed by groove 113 on the surface of pad 110. As an optional step, an imaging system may be used to locate pad 110 to assist in automated placement of semiconductor die 101 on pad 110 (FIG. 4, step 408). As part of this process, the imaging system may identify a location of groove 113. For example, groove may be detected as having a lighter color than the roughened surface of pad 110. In addition, the roughened surface of pad 110 may present a darker color than a smooth pad in alternative examples. Imaging systems used to aid in the placement of semiconductor die 101 on pad 110 may have difficulty detecting locations of the roughened surfaces of leadframe 108. Thus, groove 113 may help imaging systems detect the location of pad 110, even when the roughened surfaces of leadframe 108, including pad 110, are not readily detectable by the imaging system.

As shown in FIG. 3C, using a known location of pad 110, adhesive 140 is applied to the roughened surface of pad 110 of leadframe 108 inside of a perimeter formed by groove 113 (FIG. 4, step 410). Die attach adhesive 140 may represent a thermal interface material, such as a conductive or nonconductive thermal paste. Such examples may facilitate heat dissipation from semiconductor die 101 through pad 110. As part of applying adhesive 140, the location of pad 110 may be determined based on known positions of alignment features of leadframe strip 200 and/or using an optional imaging system. In various examples, the adhesive may be applied to contact groove 113 (see FIG. 5) or may be applied leaving a space between adhesive 140 and groove 113. When adhesive contacts groove 113, the thickness of the adhesive may increase compared to examples in which the adhesive flows freely on the roughened surface without contacting groove 113.

As shown in FIG. 3D, again using a known location of pad 110, semiconductor die 101 is placed on pad 110 in contact with adhesive 140 such that groove 113 surrounds semiconductor die 101 on the roughened surface (FIG. 4, step 412). Bond strength between adhesive 140 and mold compound 130 may be significantly less than bond strength between adhesive 140 and semiconductor die 101 and between mold compound 130 and semiconductor die 101. Thus, controlling contact areas between adhesive 140 and semiconductor die 101 and contact areas between mold compound 130 and semiconductor die 101 may provide desired adhesion between semiconductor die 101 and both adhesive 140 and mold compound 130. For example, the fillet height of adhesive 140 on semiconductor die 101 may be about half a thickness of semiconductor die 101. Such a configuration allows adhesive 140 to bond to the sides of semiconductor die 101 while leaving a portions of the sides of semiconductor die 101 available to bond to mold compound 130.

For reference, the partially assembled package shown and described with respect to FIG. 3E corresponds to the components shown in FIG. 2. As shown in FIG. 3E, adhesive 140 is cured to bond semiconductor die 101 to pad 110 (FIG. 4, step 414). Curing adhesive 140 may include holding the assembly of leadframe 108 and semiconductor die 101 at a prescribed temperature for a prescribed period of time. During curing, resin components of adhesive 140 may bleed forming resin bleed 141. Groove 113 prevents the resin from bleeding onto the roughened surface of pad 110 outside groove 113. In this manner, resin bleed 141 of adhesive 140 is adjacent to at least a portion of groove 113.

Bond strength between resin bleed 141 and mold compound 130 may be less than bond strength between pad 110 and mold compound 130. Accordingly, constraining the area of resin bleed 141 may improve adhesion between pad 110 and mold compound 130 by leaving more surfaces of pad 110 uncovered and available for direct contact with mold compound 130.

As shown in FIG. 3F, wire bonds 103 are formed between the bond pads 102 of semiconductor die 101 and leads 111 (FIG. 4, step 416). Wire bonds 103 are formed from its bond pads 102 to adjacent leads 111 and with a wire using a capillary of a metal wire bonder. For example, forming wire bonds 103 may include forming a free air ball, squashing the ball onto bond pad 102 to form a ball bond 104, spanning the wire to the corresponding lead 111, pressuring the wire to the lead to form stitch bond 105, and breaking the wire.

Following the formation of wire bonds 103, the assembly of leadframe 108, semiconductor die 101, adhesive 140, and wire bonds 103 is covered in mold compound 130 (FIG. 4, step 418). Mold compound 130 is molded around the assembled semiconductor die 101 and leadframe 108 portions. In this process, leadframe 108 with the attached and bonded semiconductor die 101 is placed in the cavity of a mold, such as a steel mold. The heated and viscous mold compound, such as an epoxy resin filled with inorganic granules, is pressured into the cavity to fill the cavity and surround semiconductor die 101 and leadframe 108 portions without voids. Mold compound 130 covers pad 110 and at least portions of leads 111, such as lead end portions 112. After polymerizing the mold compound and cooling to ambient temperature, the mold is opened, while mold compound 130 remains adhering to the molded parts. As leadframe 108 is part of leadframe strip 200, all the leadframe and die assemblies of the leadframe strip may be molded in unison. Individual semiconductor packages remain interconnected as part of leadframe strip 200 after being covered with mold compound 130.

For the finished semiconductor package 100, mold compound 130 and the assembled components are expected to retain reliable adhesion during testing and operations of semiconductor package 100 without delamination. The roughened surfaces of leadframe 108 support improved adhesion to mold compound 130 to mitigate the prevalence of delamination in semiconductor package 100.

Following molding of mold compound 130, semiconductor package 100 is singulated from the array of interconnected packages manufactured on leadframe strip 200 (FIG.

4, step 420). For example, singulation may include cutting through leadframe strip 200 to separate semiconductor package 100 from a plurality of semiconductor packages 100 manufactured on leadframe strip 200. Portions of leadframe strip 200 may be discarded following singulation, such as dam bar 117 and siderail 119. Following singulation, leads 111 may be bent into their final positions, if needed.

Figure 5:
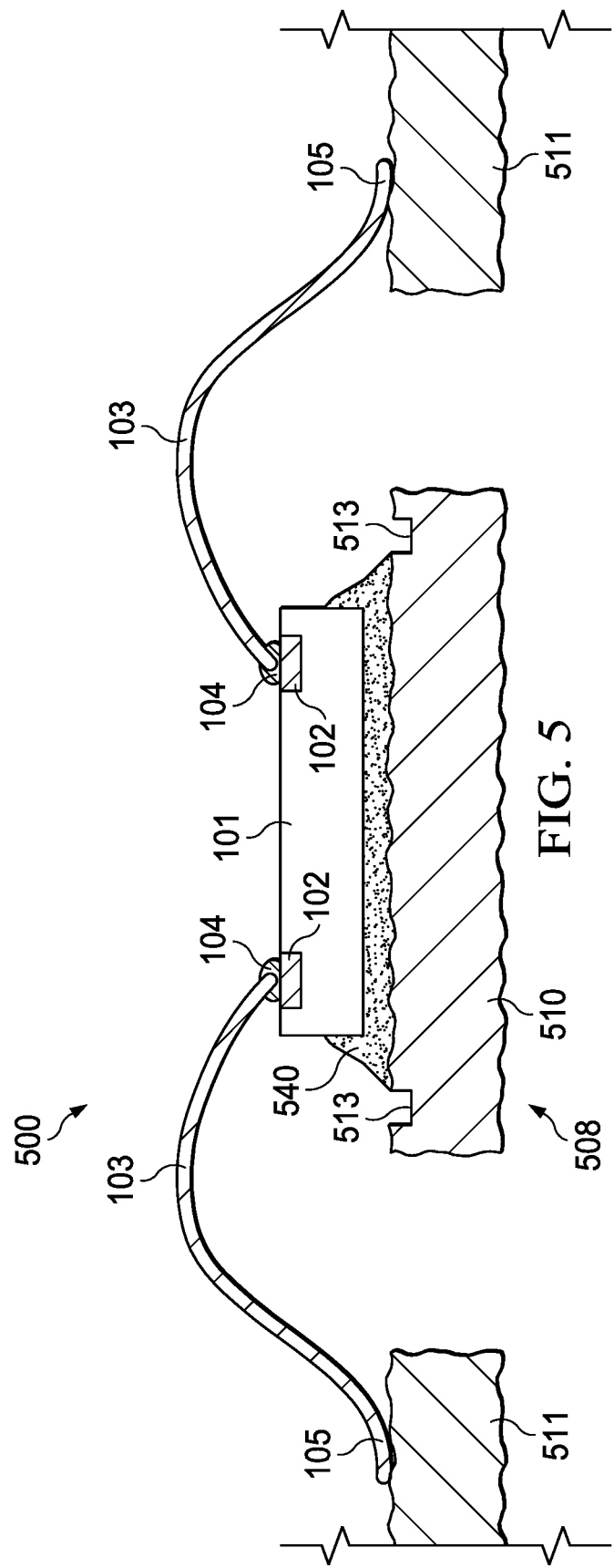
FIG. 5 is a conceptual illustration of a partially assembled semiconductor package with a groove forming a perimeter on a pad of a leadframe in an alternative configuration compared to the semiconductor package of FIGS. 1 and 2.

FIG. 5 is a conceptual illustration of a partially assembled semiconductor package 500 with a groove 513 forming a perimeter on a pad 510 of a leadframe 508 in an alternative configuration compared to semiconductor package 100. The partially assembled semiconductor package 500 illustrated in FIG. 5 corresponds to the partially assembled semiconductor package 100 illustrated in FIG. 3F.

Specifically, semiconductor package 500 is substantially similar to semiconductor package 100, except that groove 513 restricts flow of die attach adhesive 540, such that a thickness of die attach adhesive 540 may be controlled more readily. In contrast, groove 113 on pad 110 of semiconductor package 100 merely restrict flow of resin bleed 141. In all other aspects, semiconductor package 500 is the same as semiconductor package 100. For brevity, additional details included in the description of semiconductor package 100 are not repeated with respect to semiconductor package 500.

Semiconductor package 500 includes a semiconductor die 101 bonded with die attach adhesive 540 onto a metallic pad 510 of a metallic leadframe 508. Pad 510 includes groove 513 which forms a perimeter surrounding semiconductor die 101. Groove 513 restricts the flow of die attach adhesive 540 on pad 110 before and/or during the curing of die attach adhesive 540. In this manner, adhesive 540 is adjacent to at least a portion of groove 513. While not illustrated in FIG. 5, a finished semiconductor package 500 further includes a mold compound covering pad 510, semiconductor die 101, wire bonds 103, and at least partially covering leads 511.

Restricting the flow of die attach adhesive 540 with groove 513 allows a thickness of die attach adhesive 540 to be controlled during manufacturing of semiconductor package 100. A thicker layer of die attach adhesive 540 allows for increased fillet height of the adhesive on semiconductor die 101 compared to alternatives that do not restrict flow.

As with groove 113 of semiconductor package 100, groove 513 may also restrict the area of a resin bleed from die attach adhesive 540. Groove 513 may be manufactured in the same way as groove 113, such as stamping, coining or etching the roughened surface of leadframe 508, thereby tamping down protuberances forming the roughened surface.

In contrast to semiconductor package 100, with semiconductor package 500, die attach adhesive 540 is in contact with or overlaps at least a portion of groove 513. Generally, this means that groove 513 is located closer to die 101 than groove 113 of semiconductor package 100. For example, a length of each side of groove 513 is greater than the length of the adjacent side of semiconductor die 101, such as between 0 percent and 5 percent greater than the length of the adjacent side of semiconductor die 101. For example, with a 2 mm by 2 mm die, a length of each side of the rectangular perimeter may be between 2.0 mm and 2.2 mm, such as about 2.1 mm. In other examples, groove 513 may form a different shape on the surface of pad 110. In the same or different examples, groove 513 may have a depth of at least the surface roughness of the roughened surface of pad 110, such as within a range of 1 μm to 50 such as within a range of 20 μm to 30 such as about 25 μm. A width of groove 513 may be at least wide as the depth of groove 513, such as between 1-3 times the depth of groove 513. In some of such examples, the width of groove 513 may be within a range of 2 μm to 100 such as within a range of 10 μm to 60 such as such as within a range of 25 μm to 50 μm.

In some particular examples, a width of groove 513 may be within a range of 203 μm to 254 μm (8 to 10 mils). In the same or different particular examples, a length of each side of the rectangular perimeter formed by groove 513 provide a clearance within a range of 51 μm to 76 μm (2 to 3 mils) on each side of die 101. By locating groove 513 within such a clearance range, a fillet height of die attach adhesive 540 on die 101 may be about the same as with the same package design, but including a leadframe without a roughened surface. In this manner, a roughened leadframe 508 with groove 513 may replace a leadframe without a roughened surface in a manufacturing process without adjusting manufacturing parameters, such as the amount or location of die attach adhesive 540 applied to pad 510. Of course, these ranges are merely examples, and application of these techniques to particular package designs with varied die sizes and die attach adhesive properties may result in different dimensions to maintain desired fillet heights of die attach adhesive on semiconductor dies of the package.

Figure 6:
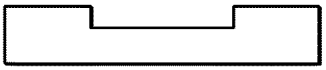
FIG. 6 is a plan view of options for grooves forming a perimeter on a pad of a leadframe.
Figure 6:
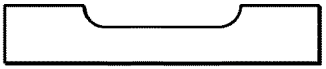
Figure 6:
Figure 6:
Figure 6:
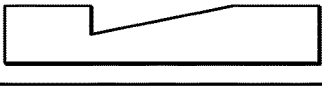
Figure 6:
Figure 6:
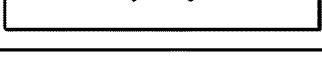
Figure 6:
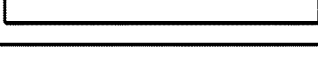

FIG. 6 illustrates possible grooves profiles that can be implemented as grooves 113, 513. FIG. 6 also lists the processes by which the grooves can be made such as stamping, coining and etching as they are associated with each type of groove. The list is exemplary and is not a complete list of all possible groove profiles. When implemented as part of a groove, the illustrated profiles would be extended along a length of a surface to form an elongated groove. Such examples may include a consistent groove profile, or the groove profile may vary over a length of an elongated groove.

The specific techniques for semiconductor packages with a groove forming a perimeter on a pad of a leadframe, such as semiconductor packages 100, 500 are merely illustrative of the general inventive concepts included in this disclosure as defined by the following claims. As an example, this disclosure applies not only to semiconductor packages with a groove forming a perimeter on a metallic pad of a leadframe, but also to other semiconductor packages with different substrates, such as nonconductive organic substrates whereby the substrate includes a groove forming a perimeter on the substrate and a semiconductor bonded to the substrate with an adhesive.

What is claimed is:

1. A semiconductor package comprising:
    a metallic pad and leads spaced from the metallic pad by a gap, the metallic pad including a roughened surface;
    a semiconductor die including bond pads; and
    an adhesive between the roughened surface of the metallic pad and the semiconductor die, therein bonding the semiconductor die to the metallic pad, wherein the adhesive includes a resin,
    wherein the metallic pad further includes a groove surrounding the semiconductor die on the roughened surface, the groove having a surface roughness less than a surface roughness of the roughened surface of the metallic pad.

2. The semiconductor package of claim 1, wherein the groove is configured to prevent the resin of the adhesive from bleeding onto the roughened surface of the metallic pad outside the groove.

3. The semiconductor package of claim 1, wherein a resin bleed of the adhesive is adjacent to at least a portion of the groove.

4. The semiconductor package of claim 1, wherein the adhesive is adjacent to at least a portion of the groove.

5. The semiconductor package of claim 1, wherein the groove forms a rectangular shape surrounding the semiconductor die on the roughened surface.

6. The semiconductor package of claim 1, wherein all surfaces of the metallic pad are roughened except for the groove.

7. The semiconductor package of claim 1, wherein a surface roughness of the metallic pad is at least 1.0 micrometers (μm).

8. The semiconductor package of claim 7, wherein a surface roughness of the groove is less than 0.5 micrometers (μm).

9. The semiconductor package of claim 1, wherein a side of the metallic pad including the roughened surface includes one or more of a group consisting of:
   a metal oxide layer;
   a micro-crystalline metal layer; and
   a rough nickel layer.

10. The semiconductor package of claim 1, further including wire bonds extending between the bond pads of the semiconductor die and the leads.

11. The semiconductor package of claim 1, further including mold compound covering the semiconductor die, the adhesive, the roughened surface of the metallic pad, and at least partially covering the leads.

12. A semiconductor package comprising:
   a metallic pad and leads spaced from the metallic pad by a gap, a side of the metallic pad including a roughened surface with a pad surface roughness of 1 to 50 micrometers (μm),
   wherein the metallic pad includes a planar base metal and layer of nickel plated on the base metal to form the roughened surface;
   a semiconductor die including bond pads;
   an adhesive between the roughened surface of the metallic pad and the semiconductor die, therein bonding the semiconductor die to the metallic pad, wherein the adhesive includes a resin,
   wherein the metallic pad further includes a groove forming a rectangular shape surrounding the semiconductor die on the roughened surface, the groove having a groove surface roughness of less than 0.5 μm;
   wire bonds extending between the bond pads of and the leads; and
   mold compound covering the semiconductor die, the adhesive, the roughened surface of the metallic pad, and the wire bonds, and at least partially covering the leads.

13. A semiconductor package comprising:
   a metallic pad and leads spaced from the metallic pad by a gap, the metallic pad including a roughened surface;
   a semiconductor die including bond pads; and
   an adhesive between the roughened surface of the metallic pad and the semiconductor die, therein bonding the semiconductor die to the metallic pad
   wherein the metallic pad further includes a groove surrounding the semiconductor die on the roughened surface, the groove including a surface roughness less than a surface roughness of the roughened surface of the metallic pad, a portion of the adhesive in the groove.

14. The semiconductor package of claim 13, wherein the adhesive includes a resin.

15. The semiconductor package of claim 13, wherein the groove forms a rectangular shape surrounding the semiconductor die on the roughened surface.

16. The semiconductor package of claim 13, wherein all surfaces of the metallic pad are roughened except for the groove.

17. The semiconductor package of claim 13, wherein a surface roughness of the metallic pad is at least 1.0 micrometers (μm).

18. The semiconductor package of claim 13, wherein a side of the metallic pad including the roughened surface includes one or more of a group consisting of:
   a metal oxide layer;
   a micro-crystalline metal layer; and
   a rough nickel layer.

19. The semiconductor package of claim 13, further including wire bonds extending between the bond pads of the semiconductor die and the leads.

20. The semiconductor package of claim 13, further including mold compound covering the semiconductor die, the adhesive, the roughened surface of the metallic pad, and at least partially covering the leads.

* * * * *